United States Patent
Ahn et al.

(10) Patent No.: US 12,234,142 B2
(45) Date of Patent: Feb. 25, 2025

(54) DEVICE, METHOD AND COMPUTER-READABLE RECORDING MEDIUM FOR DETECTING EARTHQUAKE IN MEMS-BASED AUXILIARY SEISMIC OBSERVATION NETWORK

(71) Applicants: KOREA METEOROLOGICAL ADMINISTRATION, Seoul (KR); KYUNGPOOK NATIONAL UNIVERSITY INDUSTRY-ACADEMIC COOPERATION FOUNDATION, Daegu (KR)

(72) Inventors: Jae-Kwang Ahn, Seoul (KR); Young-Woo Kwon, Daegu (KR); Jangsoo Lee, Daegu (KR); Euna Park, Seoul (KR); Eui-hong Hwang, Daejeon (KR)

(73) Assignees: KOREA METEOROLOGICAL ADMINISTRATION, Seoul (KR); KYUNGPOOK NATIONAL UNIVERSITY INDUSTRY-ACADEMIC COOPERATION FOUNDATION, Daegu (KR)

(*) Notice: Subject to any disclaimer, the term of this patent is extended or adjusted under 35 U.S.C. 154(b) by 310 days.

(21) Appl. No.: 17/884,033

(22) Filed: Aug. 9, 2022

(65) Prior Publication Data
US 2022/0380204 A1    Dec. 1, 2022

Related U.S. Application Data

(63) Continuation-in-part of application No. PCT/KR2022/006701, filed on May 11, 2022.

(30) Foreign Application Priority Data

May 14, 2021 (KR) .......................... 10-2021-0062761

(51) Int. Cl.
B81B 7/04 (2006.01)
G01V 1/01 (2024.01)
(Continued)

(52) U.S. Cl.
CPC ................. B81B 7/04 (2013.01); G01V 1/01 (2024.01); G01V 1/282 (2013.01); G01V 1/288 (2013.01);
(Continued)

(58) Field of Classification Search
None
See application file for complete search history.

(56) References Cited

U.S. PATENT DOCUMENTS

2011/0264393 A1*  10/2011  An .......................... G01P 21/00
                                                        73/1.38
2018/0188396 A1*   7/2018  Sakuma ................. G01V 1/164
(Continued)

FOREIGN PATENT DOCUMENTS

JP    2005-537484 A    12/2005
KR    10-2014-0144407 A  12/2014
(Continued)

OTHER PUBLICATIONS

Mousavi, S. Mostafa, et al. "CRED: A deep residual network of convolutional and recurrent units for earthquake signal detection." Scientific reports 9.1 (2019): 10267. (Year: 2019).*

(Continued)

*Primary Examiner* — Raymond L Nimox
(74) *Attorney, Agent, or Firm* — Bridgeway IP Law Group, PLLC; Sang Ho Lee; Hyun Woo Shin

(57) ABSTRACT

Provided are a device, method, and computer-readable recording medium for detecting an earthquake in a microelectromechanical system (MEMS)-based auxiliary seismic observation network. The method includes performing detrending of removing a moving average from original acceleration data received from single sensors of an MEMS-based auxiliary seismic observation network to preprocess the acceleration data, calculating a short-term average/long-term average (STA/LTA) value using a filter parameter value specified on the basis of the preprocessed acceleration data, generating an event occurrence message or event end message on the basis of the calculated STA/LTA value and transmitting the event occurrence message or event end message, when the event occurrence message is generated, calculating an earthquake probability through an earthquake detection deep learning model using the preprocessed accel- (Continued)

eration data as an input, and analyzing noise by calculating a power spectral density (PSD) from the original acceleration data which is merged at certain intervals.

17 Claims, 10 Drawing Sheets

(51) Int. Cl.
    *G01V 1/28*     (2006.01)
    *G01V 1/30*     (2006.01)
    *G01V 1/38*     (2006.01)

(52) U.S. Cl.
    CPC ............ *G01V 1/307* (2013.01); *G01V 1/3808* (2013.01); *B81B 2201/0285* (2013.01); *B81B 2207/05* (2013.01)

(56) References Cited

U.S. PATENT DOCUMENTS

| | | | | |
|---|---|---|---|---|
| 2018/0376314 A1* | 12/2018 | Allen | ........................ | G01V 1/01 |
| 2019/0324166 A1* | 10/2019 | Lolla | ........................ | G01V 1/42 |

FOREIGN PATENT DOCUMENTS

| | | |
|---|---|---|
| KR | 10-1957763 B1 | 3/2019 |
| KR | 10-1970149 B1 | 4/2019 |
| KR | 10-2098075 B1 | 4/2020 |
| KR | 10-2021-0046512 A | 4/2021 |
| KR | 20210046512 A | 4/2021 |
| KR | 10-2346352 B1 | 1/2022 |

OTHER PUBLICATIONS

Marusenkova, Tetyana, and Iryna Yurchak. "Method for Selecting Windows for PSD Analysis of MEMS Inertial Sensors' Signals." 2019 IEEE XVth International Conference on the Perspective Technologies and Methods in MEMS Design (MEMSTECH). IEEE, 2019. (Year: 2019).*

Taehee Lee et al./ Development of Earthquake Early Warning System nearby Epicenter based on P-wave Multiple Detection/ J. Korean Geosynthetics Society vol. 18 No. 4 Dec. 2019 pp. 107~114/ DOI: https://doi.org/10.12814/jkgss.2019.18.4.107.

* cited by examiner

DEVICE, METHOD AND COMPUTER-READABLE RECORDING MEDIUM FOR DETECTING EARTHQUAKE IN MEMS-BASED AUXILIARY SEISMIC OBSERVATION NETWORK

CROSS-REFERENCE TO RELATED APPLICATION

This application is a continuation-in-part of international patent application No. PCT/KR2022/006701 filed on May 11, 2022, and claims priority to and the benefit of Korean Patent Application No. 10-2021-0062761, filed on May 14, 2021, the disclosures of which are incorporated herein by reference in their entirety.

BACKGROUND

1. Field of the Invention

The present invention relates to a device and method for detecting an earthquake in a microelectromechanical system (MEMS)-based auxiliary seismic observation network and a recording medium for performing the method, and more particularly, to a technology for detecting an earthquake using time-series acceleration data recorded by a 3-axis accelerometer of a single device and/or an event occurring in a sensor array in a network.

2. Discussion of Related Art

Since it began observing earthquakes in 1978, the Korea Meteorological Administration has observed a large number of earthquakes. In particular, after the earthquake on Sep. 12, 2016, (Gyeongju earthquake) and the Pohang earthquake in 2017, public interest in earthquakes increased. Accordingly, high-performance seismometers for earthquake monitoring have been additionally installed all over the country to strengthen monitoring capabilities.

After an earthquake occurs, it is possible to determine the magnitude and arrival time of the earthquake through seismometers installed all over the country before seismic waves reach an arbitrary location. A system that gives a warning after an earthquake occurs before a large vibration (S wave) caused by the earthquake arrives is referred to as an earthquake early warning system. The higher the density of seismometers installed all over the country, the more easily the speed of the system can be ensured.

However, there are limitations in increasing high-performance seismometers due to the cost problem and problems in ensuring and providing installation locations. Accordingly, to overcome the limitations, a method of using a microelectromechanical system (MEMS) sensor, which shows lower performance than a high-performance seismometer but is inexpensive and small, is attracting attention. An MEMS may be additionally installed and used in various devices and thus may help to increase the density of a seismic observation network. As a result, a technology for detecting an earthquake using MEMS sensors helps minimization of damage to various facilities and human lives.

SUMMARY OF THE INVENTION

The present invention is directed to providing a method of detecting an earthquake in a microelectromechanical system (MEMS)-based auxiliary seismic observation network.

The present invention is also directed to providing a recording medium on which a computer program for performing the method of detecting an earthquake in an MEMS-based auxiliary seismic observation network is recorded.

The present invention is also directed to providing a device for performing the method of detecting an earthquake in an MEMS-based auxiliary seismic observation network.

According to an aspect of the present invention, there is provided a method of detecting an earthquake in an MEMS-based auxiliary seismic observation network, the method including performing detrending of removing a moving average from original acceleration data received from single sensors of an MEMS-based auxiliary seismic observation network to preprocess the acceleration data, calculating a short-term average/long-term average (STA/LTA) value using a filter parameter value specified on the basis of the preprocessed acceleration data, generating an event occurrence message or event end message on the basis of the calculated STA/LTA value and transmitting the event occurrence message or event end message, when the event occurrence message is generated, calculating an earthquake probability through an earthquake detection deep learning model using the preprocessed acceleration data as an input, and analyzing noise by calculating a power spectral density (PSD) from the original acceleration data which is merged at certain intervals.

The method may further include determining whether an earthquake occurs in the network using a network earthquake detection algorithm on the basis of the earthquake probability and a noise analysis result calculated from the single sensors.

The determining of whether an earthquake occurs in the network may include grouping the single sensors present in the network as a sensor arrangement and determining reliability of an earthquake event on the basis of the STA/LTA value and the noise analysis result of each single sensor.

The determining of the reliability of the earthquake event may include determining the earthquake event as a green event that activates the network earthquake detection algorithm, a yellow event that does not activate the network earthquake detection algorithm on its own but is included in the network earthquake detection algorithm when a certain condition is met, or a red event that is not used in the network earthquake detection algorithm in any case.

The determining of the reliability of the earthquake event may further include, when the earthquake event is determined to be a green event, converting the STA/LTA value into a valid event, when an earthquake is detected through the earthquake detection deep learning model and the event is determined to be a green or yellow event, changing the event to a valid event, when a sensor within a preset distance or closest to a corresponding sensor is green, changing the yellow event to a valid event, and when the event is red or a threshold time elapses in a validation-waiting state, discarding the event.

The determining of whether an earthquake occurs in the network may further include merging events occurring in a preset sensor array, and when events occur at more than half of sensors in the network, detecting an earthquake.

The determining of whether an earthquake occurs in the network may include, when an event occurs at a specific sensor and a set number of sensors or more are within a certain distance from the specific sensor, grouping the sensors in odd numbers and setting groups as a temporary sensor array, inserting the sensors to be included in the sensor array in order of reliability of the sensors based on the analysis results, and specifying a sensor having lowest noise in the sensor array as a reference sensor of the sensor array.

The calculating of the STA/LTA value may include calculating a square root of a value obtained by adding squares of 3-axis components of the acceleration data to correct an off-axis phenomenon of the sensors.

The generating of the event occurrence message or event end message may include, when the calculated STA/LTA value is greater than or equal to an event occurrence threshold, determining the calculated STA/LTA value to be event occurrence data, and when the calculated STA/LTA value is smaller than or equal to an event end threshold, determining the calculated STA/LTA value to be event end data.

The calculating of the earthquake probability through the earthquake detection deep learning model may include extracting a characteristic value through a convolutional neural network (CNN) and calculating the earthquake probability through a recurrent neural network (RNN) on the basis of the extracted characteristic value.

The analyzing of the noise may include calculating at least one characteristic value among an average, a standard deviation, an interquartile range value, the number of outliers, a difference between a maximum value and a minimum value, and a mean square error regarding two frequency bands as a PSD calculation result and inputting the calculated characteristic value to a clustering model to generate a cluster.

According to another aspect of the present invention, there is provided a computer-readable recording medium on which a computer program for performing the method of detecting an earthquake in an MEMS-based auxiliary seismic observation network is recorded.

According to another aspect of the present invention, there is provided a device for detecting an earthquake in an MEMS-based auxiliary seismic observation network, the device including a preprocessor configured to perform detrending of removing a moving average from original acceleration data received from single sensors of an MEMS-based auxiliary seismic observation network to preprocess the acceleration data, an STA/LTA unit configured to calculate an STA/LTA value using a filter parameter value specified on the basis of the preprocessed acceleration data, an event generating unit configured to generate an event occurrence message or event end message on the basis of the calculated STA/LTA value and transmit the event occurrence message or event end message, a deep learning unit configured to calculate an earthquake probability through an earthquake detection deep learning model using the preprocessed acceleration data as an input when the event occurrence message is generated, and a noise analyzing unit configured to analyze noise by calculating a PSD from the original acceleration data which is merged at certain intervals.

The device may further include a network-based earthquake detection module configured to determine whether an earthquake occurs in the network using a network earthquake detection algorithm on the basis of the earthquake probability and a noise analysis result calculated by the single sensors.

The network-based earthquake detection module may include a sensor arranging unit configured to group the single sensors in the network as a sensor arrangement and a reliability determining unit configured to determine reliability of an earthquake event on the basis of the STA/LTA value and the noise analysis result of each single sensor.

The reliability determining unit may determine the earthquake event as a green event that activates the network earthquake detection algorithm, a yellow event that does not activate the network earthquake detection algorithm on its own but is included in the network earthquake detection algorithm when a certain condition is met, or a red event that is not used in the network earthquake detection algorithm in any case.

The network-based earthquake detection module may further include an event validating unit configured to convert the STA/LTA value into a valid event when the earthquake event is determined to be a green event, change the event to a valid event when an earthquake is detected through the earthquake detection deep learning model and the earthquake event is determined to be a green or yellow event, change the yellow event to a valid event when a sensor within a preset distance or closest to a corresponding sensor is green, and discard the event when the event is red or a threshold time elapses in a validation-waiting state.

The network-based earthquake detection module may merge events occurring in a preset sensor array and detect an earthquake when events occur at more than half of sensors in the network.

When an event occurs at a specific sensor and a set number of sensors or more are within a certain distance from the specific sensor, the network-based earthquake detection module may designate a sensor having lowest noise in the sensor array as a reference sensor of the sensor array, insert the sensors to the sensor array in order of reliability of the sensors based on analysis results, and group the sensors in odd numbers to set a temporary sensor array.

The STA/LTA unit may calculate a square root of a value obtained by adding squares of 3-axis components of the acceleration data to correct an off-axis phenomenon of the sensors.

The event generating unit may determine the calculated STA/LTA value to be event occurrence data when the calculated STA/LTA value is greater than or equal to an event occurrence threshold and determine the calculated STA/LTA value to be event end data when the calculated STA/LTA value is smaller than or equal to an event end threshold.

The deep learning unit may include a CNN unit configured to extract a characteristic value and an RNN unit configured to calculate the earthquake probability on the basis of the extracted characteristic value.

The noise analyzing unit may calculate at least one characteristic value among an average, a standard deviation, an interquartile range value, the number of outliers, a difference between a maximum value and a minimum value, and a mean square error regarding two frequency bands as a PSD calculation result and input the calculated characteristic value to a clustering model to generate a cluster.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
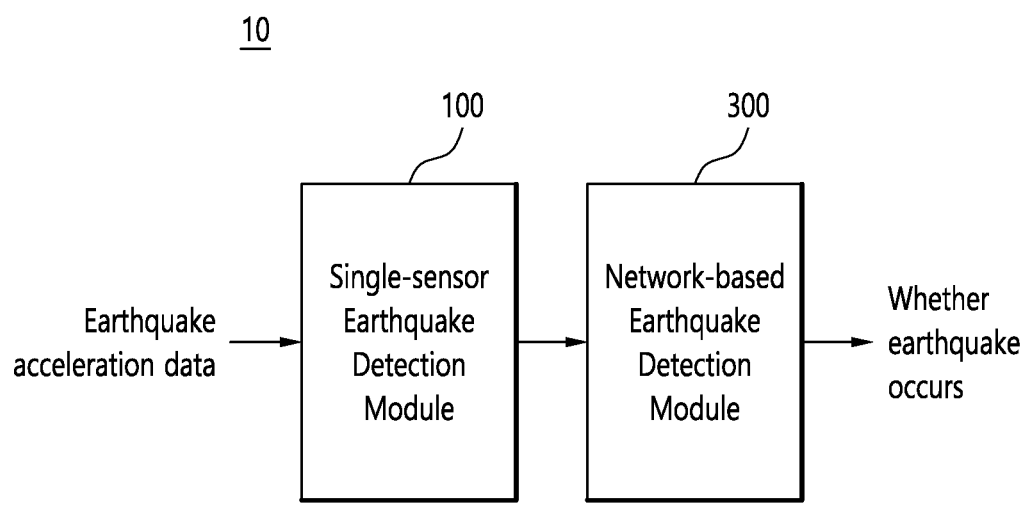
FIG. 1 is a block diagram of a device for detecting an earthquake in a microelectromechanical system (MEMS)-based auxiliary seismic observation network according to an exemplary embodiment of the present invention.

The following detailed description of the present invention is accompanied by the drawings which illustrate specific embodiments for implementing the present invention. The embodiments are described in sufficient detail to enable those of ordinary skill in the art to implement the present invention. It should be understood that various embodiments of the present invention are different but are not necessarily exclusive of each other. For example, specific shapes, structures, and characteristics described herein in relation to one embodiment may be implemented in other embodiments without departing from the spirit and scope of the present invention. It is also to be understood that the locations or arrangement of individual components in each of the disclosed embodiments may be changed without departing from the spirit and scope of the present invention. Accordingly, the detailed description set forth herein is not to be taken as limiting, and the scope of the present invention is limited only by the appended claims and all equivalents thereto when properly described. Throughout the drawings, like reference numerals refer to like elements in several aspects.

The term "unit" or "module" are defined herein as having its broadest definition to ordinary skill in the art, including software including instructions executable in a non-transitory computer-readable medium that would perform the associated function when executed, a circuit designed to perform the associated function, hardware designed to perform the associated function, or a combination of software, a circuit, or hardware designed to perform the associated function.

Further, it is to be understood that all detailed descriptions mentioning specific embodiments of the present disclosure as well as principles, aspects, and embodiments of the present disclosure are intended to include structural and functional equivalences thereof. Further, it is to be understood that these equivalences include an equivalence that will be developed in the future as well as an equivalence that is currently well-known, that is, all elements invented so as to perform the same function regardless of a structure.

Therefore, it is to be understood that, for example, block diagrams of the present specification illustrate a conceptual aspect of an illustrative circuit for embodying a principle of the present disclosure. Therefore, it is to be understood that all flow charts, state transition diagrams, pseudo-codes, and the like, illustrate various processes that may be tangibly embodied in a computer-readable medium and that are executed by computers or processors regardless of whether or not the computers or the processors are clearly illustrated.

Functions of various elements including processors or functional blocks represented as concepts similar to the processors and illustrated in the accompanying drawings may be provided using hardware having capability to execute software in connection with appropriate software as well as dedicated hardware. When the functions are provided by the processors, they may be provided by a single dedicated processor, a single shared processor, or a plurality of individual processors, and some of them may be shared with each other.

In addition, the explicit use of terms presented as the processor, control, or similar concepts should not be interpreted exclusively by quoting hardware capable of executing software, but should be understood to implicitly include, without limitation, digital signal processor (DSP) hardware, a ROM for storing software, a RAM, and a non-volatile memory. The above-mentioned terms may also include well-known other hardware.

In the claims of the present specification, components represented as means for performing functions mentioned in a detailed description are intended to include all methods for performing functions including all types of software including, for example, a combination of circuit devices performing these functions, firmware/micro codes, or the like, and are coupled to appropriate circuits for executing the software so as to execute these functions. It is to be understood that since functions provided by variously mentioned means are combined with each other and are combined with a method demanded by the claims in the present disclosure defined by the claims, any means capable of providing these functions are equivalent to means recognized from the present specification.

Hereinafter, exemplary embodiments of the present invention will be described in detail with reference to the accompanying drawings.

FIG. 1 is a block diagram of a device for detecting an earthquake in a microelectromechanical system (MEMS)-based auxiliary seismic observation network according to an exemplary embodiment of the present invention.

A device 10 for detecting an earthquake in an MEMS-based auxiliary seismic observation network according to the present invention (hereinafter, "device") performs earthquake detection and noise analysis on time-series acceleration data recorded by a 3-axis accelerometer and determines whether an earthquake actually occurs on the basis of earthquake detection results and noise analysis results calculated by single sensors in the network.

Referring to FIG. 1, the device 10 according to the present invention includes a single-sensor earthquake detection module 100 and a network-based earthquake detection module 300.

In the device 10 of the present invention, software (an application) for performing earthquake detection in an MEMS-based auxiliary seismic observation network may be installed and executed. The single-sensor earthquake detection module 100 and the network-based earthquake detection module 300 may be controlled by the software for performing earthquake detection in an MEMS-based auxiliary seismic observation network executed in the device 10.

The device 10 may be a terminal or some modules of a terminal. Also, the single-sensor earthquake detection module 100 and the network-based earthquake detection module 300 may be formed as an integrated module or one or more modules. On the other hand, the single-sensor earthquake detection module 100 and the network-based earthquake detection module 300 may be separate modules.

The device 10 may be movable or fixed. The device 10 may be a server or engine and may be referred to by another term, such as "device," "apparatus," terminal," "user equipment (UE)," "mobile station," "wireless device," "handheld device," etc.

The device 10 may execute or produce various software on the basis of an operating system (OS), that is, a system. The OS is a system program for allowing software to use hardware of the device and may be any one of mobile computer OSs, such as Android OS, iOS, Windows Mobile OS, Bada OS, Symbian OS, BlackBerry OS, etc., and computer OSs such as Windows, Linux, Unix, MAC, AIX, HP-UX, etc.

The single-sensor earthquake detection module 100 performs earthquake detection and noise analysis on time-series acceleration data recorded by a 3-axis accelerometer of a single device.

Earthquake detection is performed using a deep learning model and short-term average/long-term average (STA/LTA) calculation. The deep learning model is used for precisely detecting earthquake and determining whether an event corresponds to an earthquake when the event occurs. STA/LTA is an energy-based trigger technique that allows tracking of a sudden change in momentum and thus is used in low-noise sensors for rapid earthquake detection, event end-time check, etc.

Noise analysis is performed through power spectral density (PSD) calculation. Several characteristic values may be extracted from a PSD to determine whether an event of a corresponding sensor is reliable.

Figure 2:
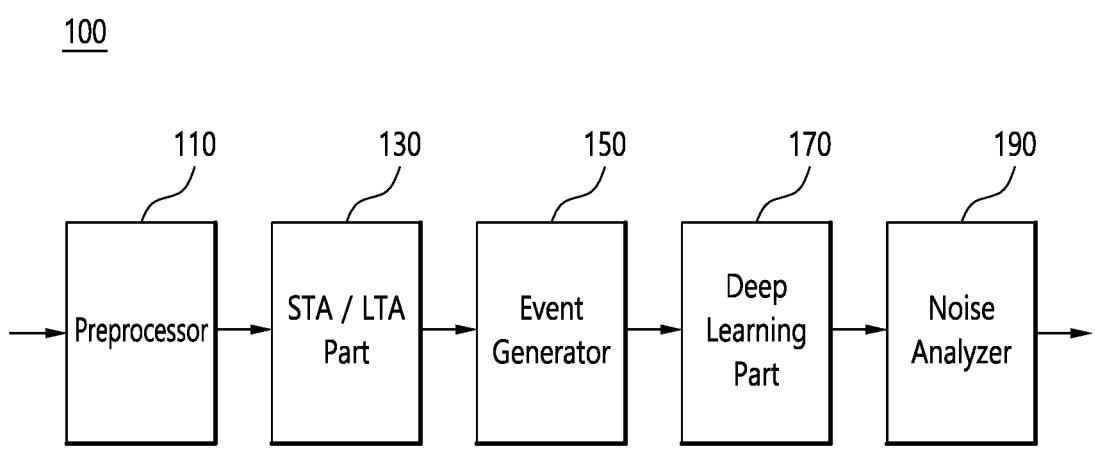
FIG. 2 is a detailed block diagram of a single-sensor earthquake detection module of FIG. 1.

To this end, referring to FIG. 2, the single-sensor earthquake detection module 100 includes a preprocessor 110, an STA/LTA unit 130, an event generating unit 150, a deep learning unit 170, and a noise analyzing unit 190.

For earthquake detection, the single-sensor earthquake detection module 100 first removes a moving average from acceleration data to generate trend-removed acceleration data and then executes an STA/LTA algorithm and a deep learning model on the basis of the preprocessed data.

Also, non-preprocessed data is gathered in units of certain time periods (e.g., one hour) and used for noise analysis. Results processed by single sensors are integrated in a network analysis operation and used for finally determining whether an earthquake occurs.

The preprocessor 110 performs acceleration data detrending. When the acceleration data arrives at the server, the acceleration data is used first for generating completely processed acceleration data through a preprocessing operation. Since different filters are employed in the STA/LTA algorithm and the deep learning model, necessary detrending is performed in both types of processing in the corresponding operation.

The STA/LTA unit 130 may calculate an STA/LTA using a filter parameter value specified on the basis of the preprocessed acceleration data. In this case, a bandpass filter may be applied to the preprocessed acceleration data, and then STA/LTA calculation may be performed.

According to an exemplary embodiment, a filter profile may use 1 Hz to 25 Hz and 2-order as default values and may use 2.5 and 0.5 in the case of STA/LTA.

Also, to correct an off-axis phenomenon of the accelerometer, a square root of a value obtained by adding squares of the 3-axis components as shown in Equation 1 is used to calculate an STA/LTA as shown in Equations 2 and 3.

$$tr=\sqrt{N^2+E^2+Z^2} \cdot \text{sign}(Z) \quad \text{[Equation 1]}$$

$$cft=\text{STA/LTA}(tr) \quad \text{[Equation 2]}$$

$$\text{Standard } STA_{i+1}=STA_i+\{x(i)-x(x-N_{STA})\}/N_{STA}$$

$$\text{Recursive } STA_{i+1}=STA_i+\{x(i)-STA_i)\}/N_{STA} \quad \text{[Equation 3]}$$

According to the STA/LTA algorithm, averages of absolute amplitude values of earthquake signals (an STA and LTA) are continuously calculated from two consecutive time windows, and then a ratio of the two values is used as a characteristic function (charfnt). Here, the STA value is an average for a short time period and thus is sensitive to an instantaneous signal (earthquake signal), and the LTA value reflects information on a current noise environment of a place where a sensor is located at a corresponding time.

The event generating unit 150 generates an event occurrence message or event end message on the basis of the calculated STA/LTA value and transmits the event occurrence message or event end message to the network-based earthquake detection module 300.

According to an exemplary embodiment, when the calculated STA/LTA value is greater than or equal to a preset event occurrence threshold, the STA/LTA value may be determined to be event occurrence data, and when the calculated STA/LTA value is smaller than or equal to a preset event end threshold, the STA/LTA value may be determined to be event end data.

When the event occurrence message is generated by the event generating unit 150, the deep learning unit 170 calculates an earthquake probability through an earthquake detection deep learning model using the preprocessed acceleration data as an input.

A convolutional recurrent neural network (CRNN) is a deep learning model for determining whether corresponding time-series data is an earthquake signal using 2-second acceleration data as an input. The deep learning model includes a convolutional neural network (CNN) unit that extracts a characteristic value and a recurrent neural network (RNN) unit that calculates an earthquake probability on the basis of the characteristic value.

According to an exemplary embodiment, the CRNN model is designed on the basis of 100 samples per second. Values obtained by removing axis-specific averages from original 3-axis acceleration data are received as inputs. 2-second data is halved into 1-second data. Subsequently, from each piece of the 1-second data, 64 channels are generated by moving a 3×3 filter one unit by one unit (stride 1), and then 64 channels are generated by moving a 3×64 filter one unit by one unit (stride 1). Max-pooling is performed on the channels that are generated two times to finish characteristic extraction, and extracted characteristics are flattened and used as inputs of the RNN (3072×1).

The RNN may be used for the model to recognize the chronological order of the two pieces of time-series data divided in units of one second. The former 1-second data is input to an initial recurrent layer, and then the latter 1-second data is input such that an output of the recurrent layer is generated. Finally, the output passes through a fully connected layer, and a final probability is calculated.

To maximize the throughput of the deep learning model when the CRNN model is executed, a model execution application may generate a minibatch to hold data and then process all the data at once. When an artificial intelligence model is executed, processing a certain number of inputs through a batch is advantageous in terms of processing time compared to the case of processing the same number of inputs as single inputs. Accordingly, data is processed as described above.

According to settings, every time data is prepared, the model may be executed to process the data, or data may be processed at certain time intervals. The current earthquake detection model is used in a batch manner and may operate every time 50 pieces of data (50 sensors) are prepared or, for example, 50 ms pass after a last execution time.

The noise analyzing unit 190 analyzes noise by calculating a PSD from the original acceleration data which is merged at certain intervals. In other words, to measure the reliability of an event occurring at each sensor, the noise analyzing unit 190 calculates a PSD and performs noise analysis on the basis of the PSD.

The PSD may be calculated by performing a direct Fourier transform or the Cooley-Tukey algorithm on earthquake data.

After the PSD calculation, an average, a standard deviation, an interquartile range value, the number of outliers, the difference between a maximum value and a minimum value, and a mean square error may be calculated regarding two frequency bands (e.g., 50 Hz to 1 Hz and 1 Hz to 0.1 Hz) as characteristic values, and a total of 12 characteristic values may be used. The characteristic values are used as inputs to a K-means clustering model, which is trained in advance, to determine a cluster.

The network-based earthquake detection module 300 determines whether an earthquake actually occurs using a network earthquake detection algorithm in the network on the basis of the earthquake detection result and noise analysis result calculated from the single-sensor earthquake detection module 100.

Figure 3:
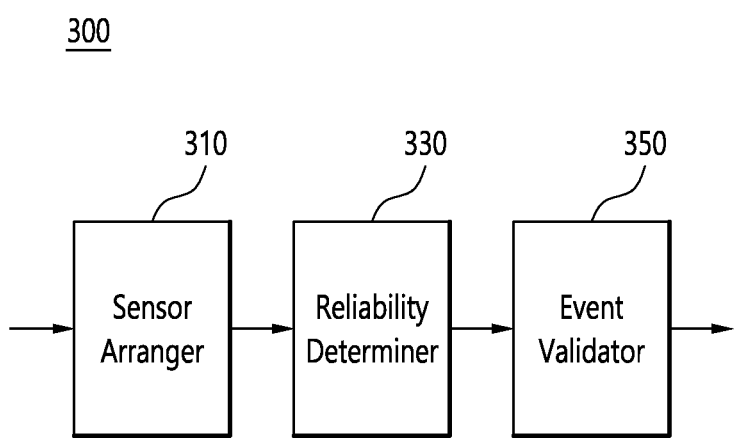
FIG. 3 is a detailed block diagram of a network-based earthquake detection module of FIG. 1.

Referring to FIG. 3, the network-based earthquake detection module 300 may include a sensor arranging unit 310, a reliability determining unit 330, and an event validating unit 350. When several sensors in the network are distributed over a small area, the sensor arranging unit 310 groups the sensors as one sensor array.

The reliability determining unit 330 determines whether an earthquake detection event received from each sensor is reliable on the basis of a noise analysis result of the sensor.

According to an exemplary embodiment, in a reliability determination operation, an event may be classified as a green event, a yellow event, or a red event in three stages. A green event is an event that may activate the network earthquake detection algorithm. A yellow event is an event that may not activate the network earthquake detection algorithm on its own but may be included in the network earthquake detection algorithm when a green event occurs nearby. A red event is an event that does not use the network earthquake detection algorithm in any case.

When an event is detected by the deep learning model, the event validating unit 350 may activate the network earthquake detection algorithm even if the corresponding sensor shows yellow reliability. Also, when there is an event caused by an STA/LTA, the deep learning model may determine that the event is not an earthquake. In this case, the event validating unit 350 cancels the event.

When an event occurs in a reliable sensor and sensor array, the event validating unit 350 respecifies an event classified as a yellow event within a certain distance (e.g., 6 km) from the sensor as a green event. An event that has undergone the corresponding process is referred to as an "activated event."

In other words, when an STA/LTA value is determined to be a green event on the basis of the reliability, the STA/LTA value is converted into a valid event, and in the case of the deep learning model, up to yellow events are reliable. A yellow event is changed to a valid event when a corresponding sensor is within the certain distance (e.g., 6 km) from a green sensor or closest to a green sensor. When an event is red or a certain time (e.g., 20 seconds) elapses in a validation-waiting state, the event is discarded.

According to an exemplary embodiment, in the network-based earthquake detection module 300, an event occurring at a sensor set in advance to operate in the sensor array is used in combination with events occurring in the sensor array to finally determine whether an earthquake occurs.

A result of determining whether an earthquake occurs from the event may be prioritized compared to a determination result based on the single sensors. According to an exemplary embodiment, when an event occurs at a specific sensor, a certain number of (e.g., five) sensors or more may be near (e.g., within a default of 2 km from) the sensor. In this case, the network-based earthquake detection module 300 may group and use the sensors as a temporary sensor array.

Here, sensors are grouped in odd numbers, and when sensors to be included in an array are selected, the sensors may be inserted in order of quality based on noise analysis results. As a reference sensor for the sensor array, a sensor that shows lowest noise and best quality in the sensor network may be selected.

Therefore, according to the present invention, event reliability is determined on the basis of earthquake detection results and noise analysis results calculated by single sensors, and only events having high reliability are used in a network earthquake detection algorithm. Accordingly, it is possible to accurately determine whether an earthquake occurs.

Figure 4:
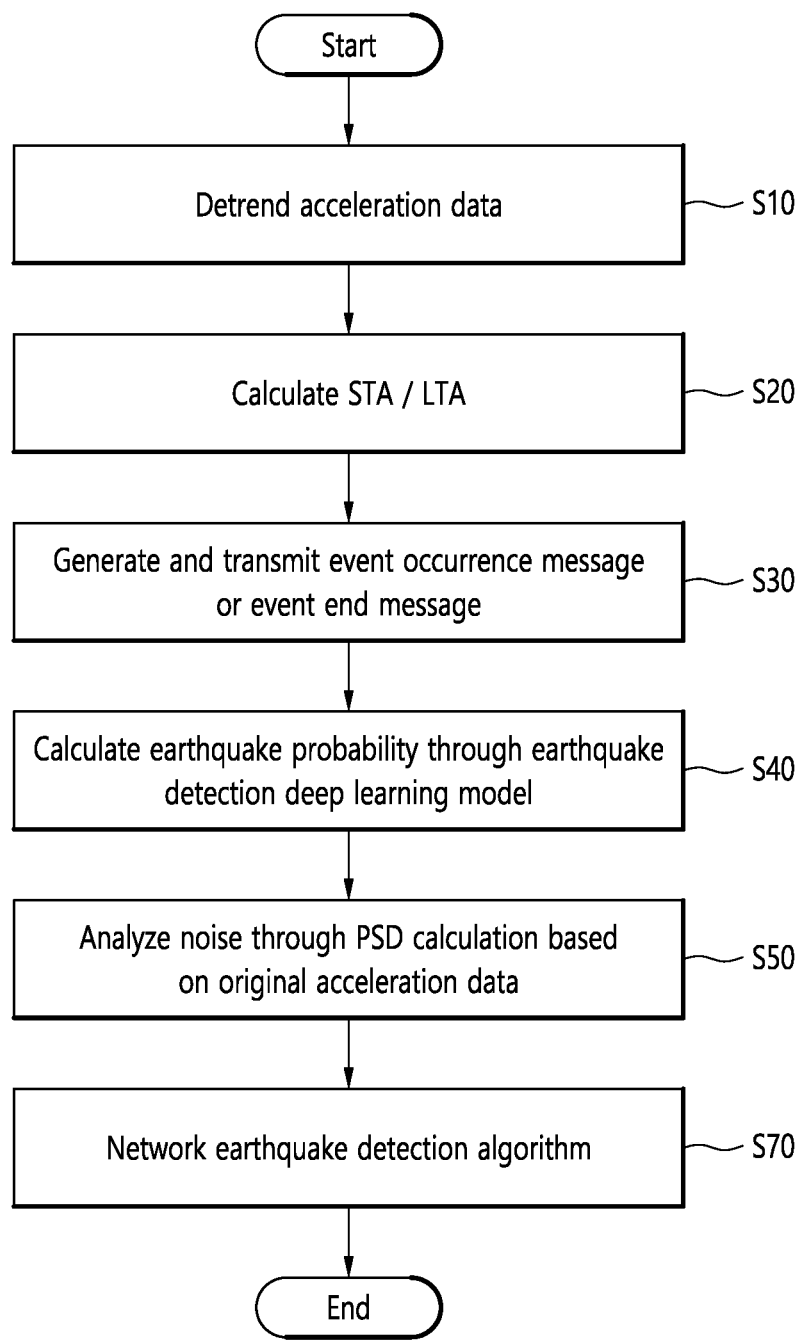
FIG. 4 is a flowchart illustrating a method of detecting an earthquake in an MEMS-based auxiliary seismic observation network according to an exemplary embodiment of the present invention.

FIG. 4 is a flowchart illustrating a method of detecting an earthquake in an MEMS-based auxiliary seismic observation network according to an exemplary embodiment of the present invention.

The method of detecting an earthquake in an MEMS-based auxiliary seismic observation network according to the exemplary embodiment of the present invention may be performed in a configuration that is substantially the same as the device 10 of FIG. 1. Accordingly, the same reference numerals will be given to components identical to those of the device 10 shown in FIG. 1, and overlapping descriptions of the components will be omitted.

The method of detecting an earthquake in an MEMS-based auxiliary seismic observation network according to the exemplary embodiment may be executed by software (an application) for performing earthquake detection in an MEMS-based auxiliary earthquake observation network.

According to the present invention, earthquake detection and noise analysis are performed on time-series acceleration data recorded by a 3-axis accelerometer, and it is determined whether an earthquake actually occurs on the basis of earthquake detection results and noise analysis results calculated by single sensors.

Referring to FIG. 4, in the method of detecting an earthquake in an MEMS-based auxiliary seismic observation network according to the exemplary embodiment, detrending of removing a moving average from original acceleration data received from single sensors of an MEMS-based auxiliary seismic observation network is performed to preprocess the acceleration data (operation S10).

Since different filters are employed in an STA/LTA algorithm and a deep learning model, necessary detrending is performed in both types of processing in the corresponding operation.

Figure 5:
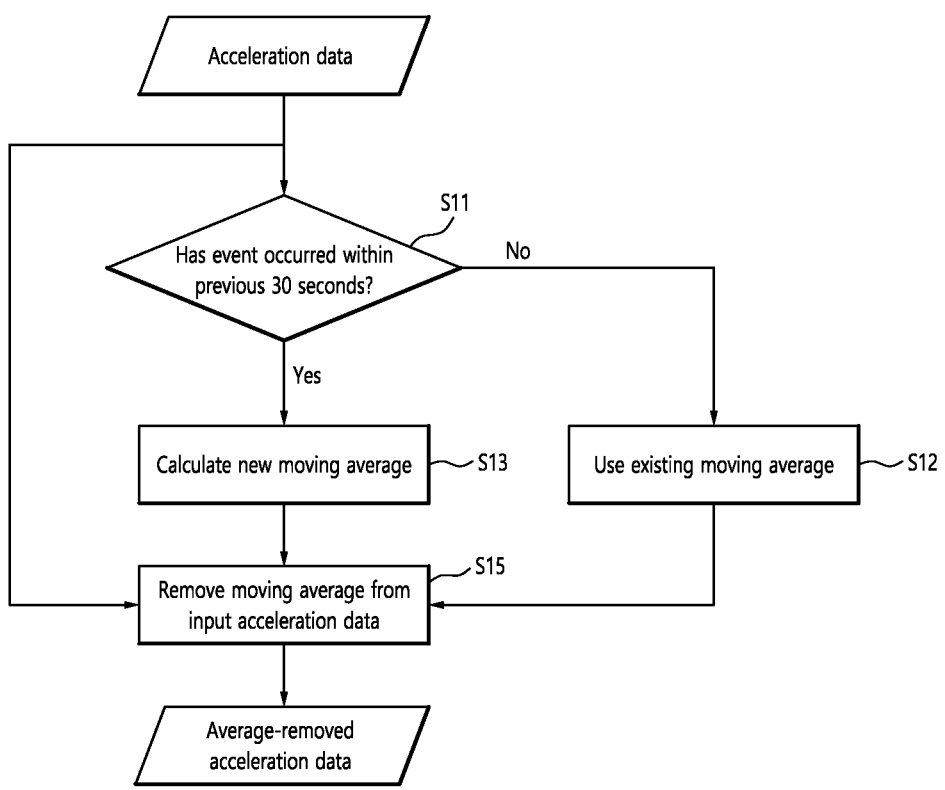
FIG. 5 is a detailed flowchart of an acceleration data detrending process of FIG. 4.

Referring to FIG. 5, in the data preprocessing operation (operation S10), it is determined whether an event has occurred within a certain previous time (e.g., 30 seconds) from the original acceleration data received from single sensors (operation S11).

When an event has occurred within the certain time, a new moving average is calculated (operation S13). Otherwise, an existing moving average is used (operation S12) to perform detrending of removing a moving average from the input acceleration data (operation S15). As a result, average-removed acceleration data is obtained.

A filter parameter value specified on the basis of the preprocessed acceleration data is applied to calculate an STA/LTA (operation S20).

Figure 6:
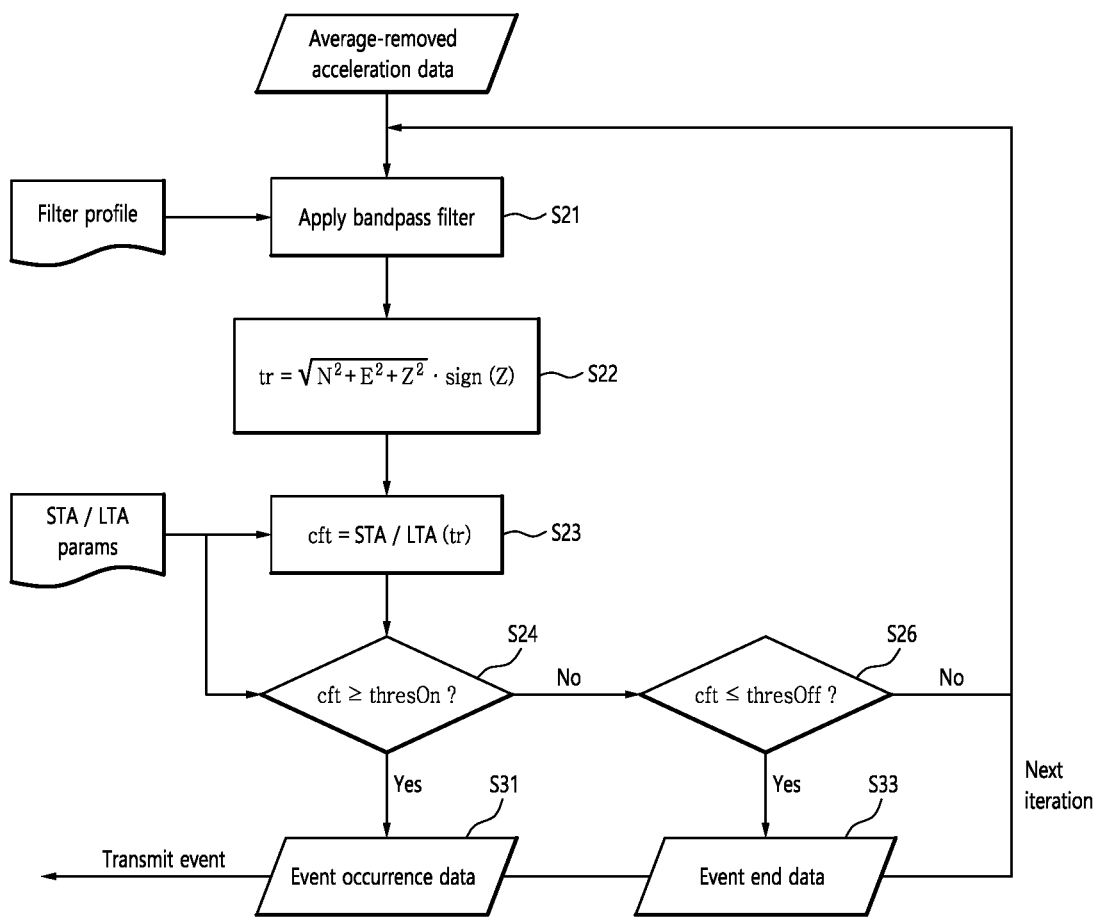
FIG. 6 is a detailed flowchart of a short-term average/long-term average (STA/LTA) calculation process of FIG. 4.

Referring to FIG. 6, a set filter profile is applied to the average-removed acceleration data obtained in the data preprocessing operation (operation S10) such that a band-pass filter is applied (operation S21). Subsequently, a square root of a value obtained by adding squares of 3-axis components of the acceleration data is calculated to correct an off-axis phenomenon of a sensor (operation S22). An STA/LTA parameter is set on the basis of a data value obtained by correcting the off-axis phenomenon to calculate an STA/LTA value (operation S23).

An event occurrence message or event end message is generated on the basis of the calculated STA/LTA value and transmitted (operation S30).

Referring to FIG. 6, when the calculated STA/LTA value is greater than or equal to a preset event occurrence threshold (operation S24), the STA/LTA value is determined to be event occurrence data, and an event is transmitted (operation S31).

When the calculated STA/LTA value is smaller than or equal to a preset event end threshold (operation S26), the STA/LTA value is determined to be event end data, an event is transmitted (operation S33), and the next operation is performed.

When an event occurrence message is generated, an earthquake probability is calculated through an earthquake detection deep learning model using the preprocessed acceleration data as an input (operation S40).

In the operation of calculating the earthquake probability (operation S40), a characteristic value may be extracted through a CNN, and the earthquake probability may be calculated through an RNN on the basis of the extracted characteristic value.

A PSD is calculated from the original acceleration data merged at certain intervals to analyze noise (operation S50).

Figure 7:
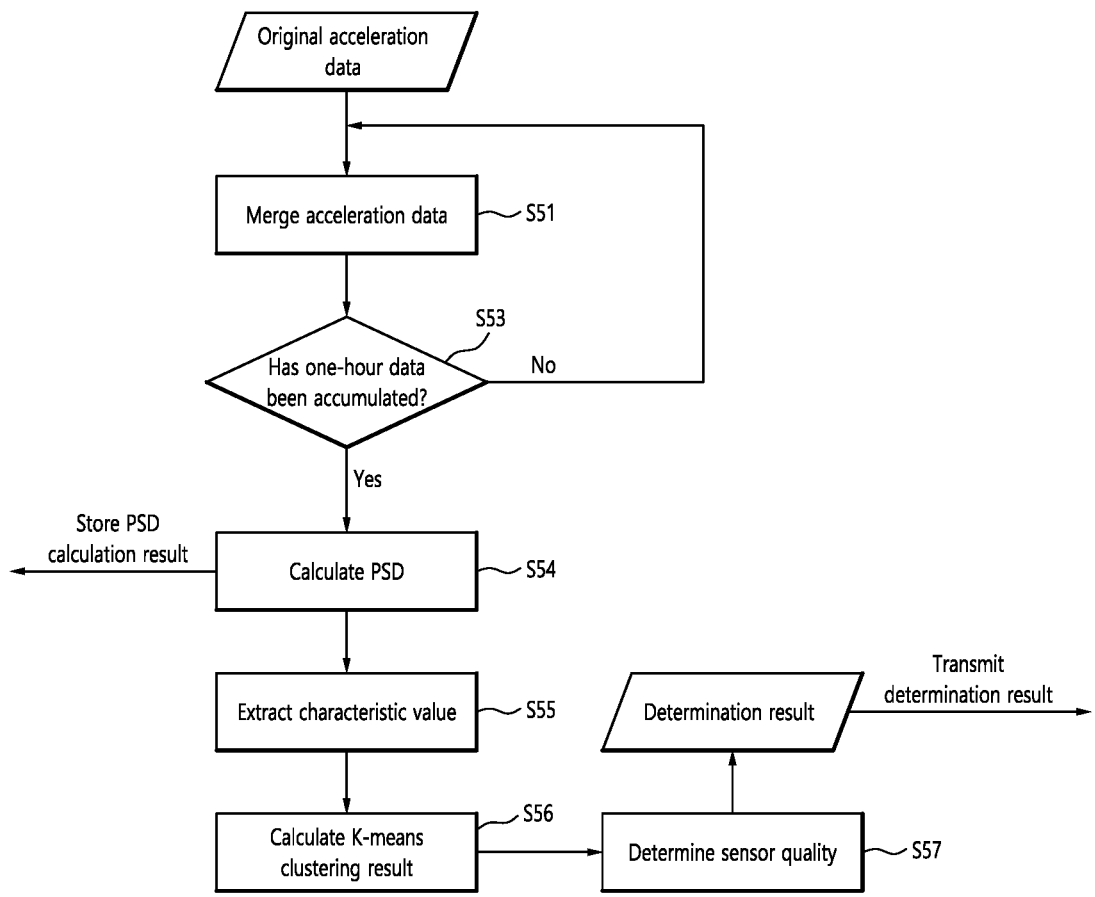
FIG. 7 is a detailed flowchart of a noise analysis process of FIG. 4 based on power spectral density (PSD) calculation.

Referring to FIG. 7, in the operation of analyzing noise (operation S50), the original acceleration data is merged (operation S51), and it is checked that data is accumulated for a certain time period (e.g., one hour) (operation S53). When the certain time period elapses, a PSD is calculated and stored (operation S54).

At least one characteristic value among an average, a standard deviation, an interquartile range value, a number of outliers, the difference between a maximum value and a minimum value, and a mean square error regarding two frequency bands is calculated as the PSD calculation result (operation S55).

The calculated characteristic value is input to a clustering model to generate a cluster (operation S56). Sensor quality is determined (operation S57), and the determination result is transmitted to a network earthquake detection algorithm.

The network earthquake detection algorithm is used to determine whether an earthquake occurs in a network on the basis of earthquake probabilities and noise analysis results calculated from the single sensors (operation S70).

First, the reliability of an earthquake event is determined on the basis of the STA/LTA value and noise analysis result of each single sensor. In this case, earthquake events may be classified as a green event that activates the network earthquake detection algorithm, a yellow event that does not activate the network earthquake detection algorithm on its own but is included in the network earthquake detection algorithm when a certain condition is met, or a red event that is not used in the network earthquake detection algorithm in any case.

Figure 8:
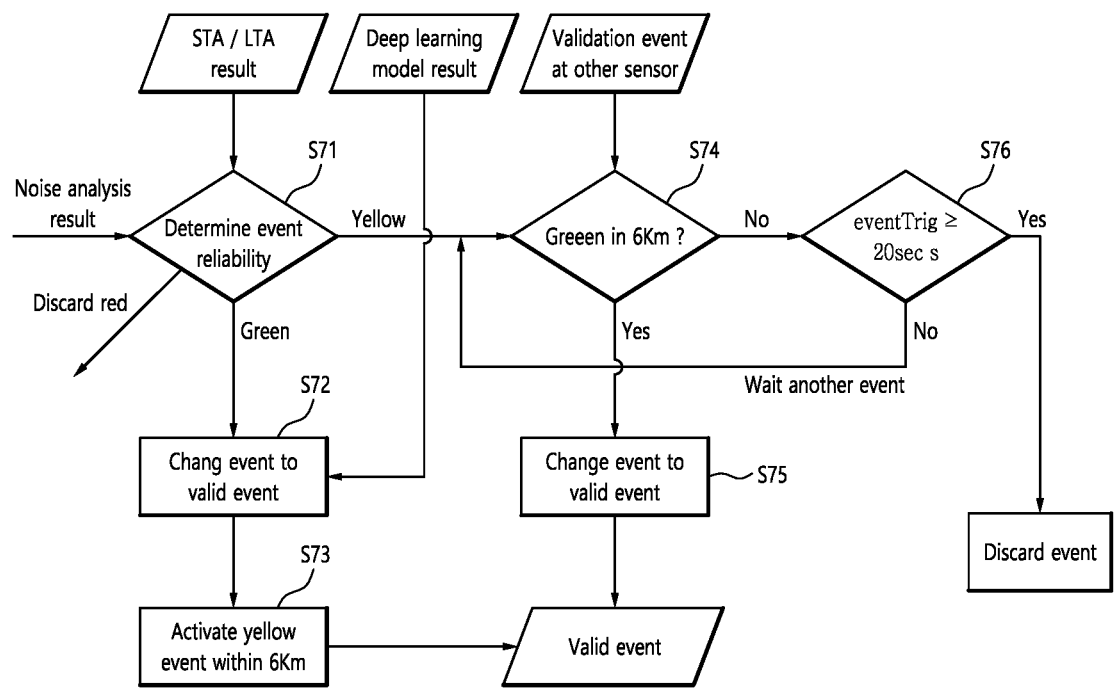
FIG. 8 is a detailed flowchart of an event validation process of a network earthquake detection algorithm of FIG. 4.

Referring to FIG. 8, in an event validation process, the event reliability of the STA/LTA value is determined (operation S71). When the reliability of the event is determined to be green, the event is changed to a valid event (operation S72), and a red event is discarded.

When an earthquake is detected through the earthquake detection deep learning model and the reliability of the event is determined to be green or yellow, the event is changed to a valid event (operation S72).

When a corresponding sensor is within a preset distance (e.g., 6 km) from a green sensor or closest to a green sensor (operations S73 or S74), a yellow event of the STA/LTA value is changed to a valid event (operation S75).

When an event is red or a threshold time (e.g., 20 seconds) elapses in a validation-waiting state (operation S76), the event is discarded.

According to an exemplary embodiment, in the operation of determining whether an earthquake occurs in the network (operation S70), an event occurring at a sensor that is configured in advance to operate in a sensor array is used in combination with events occurring in the array to detect an earthquake.

Figure 9:
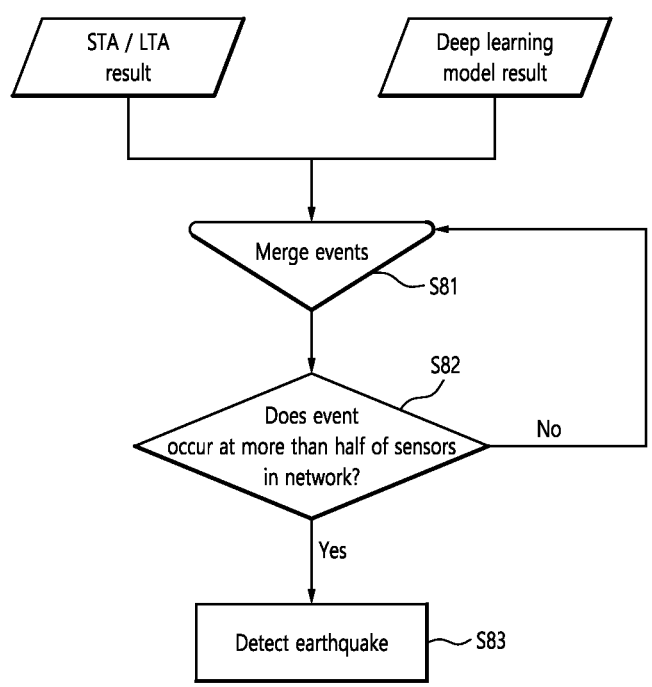
FIG. 9 is a detailed flowchart of a preset sensor arrangement event analysis process of a network earthquake detection algorithm of FIG. 4.

Referring to FIG. 9, events occurring in the sensor array which is set in advance are merged on the basis of the STA/LTA values and noise analysis results (operation S81). When an event occurs at more than half of sensors in the network (operation S82), it is determined that an earthquake occurs (operation S83).

The result of determining whether an earthquake occurs on the basis of the corresponding event may be prioritized compared to a determination result based on single sensors.

According to an exemplary embodiment, in the operation of determining whether an earthquake occurs in the network (operation S70), when an event occurs at a specific sensor, a dynamic sensor array may be configured.

Figure 10:
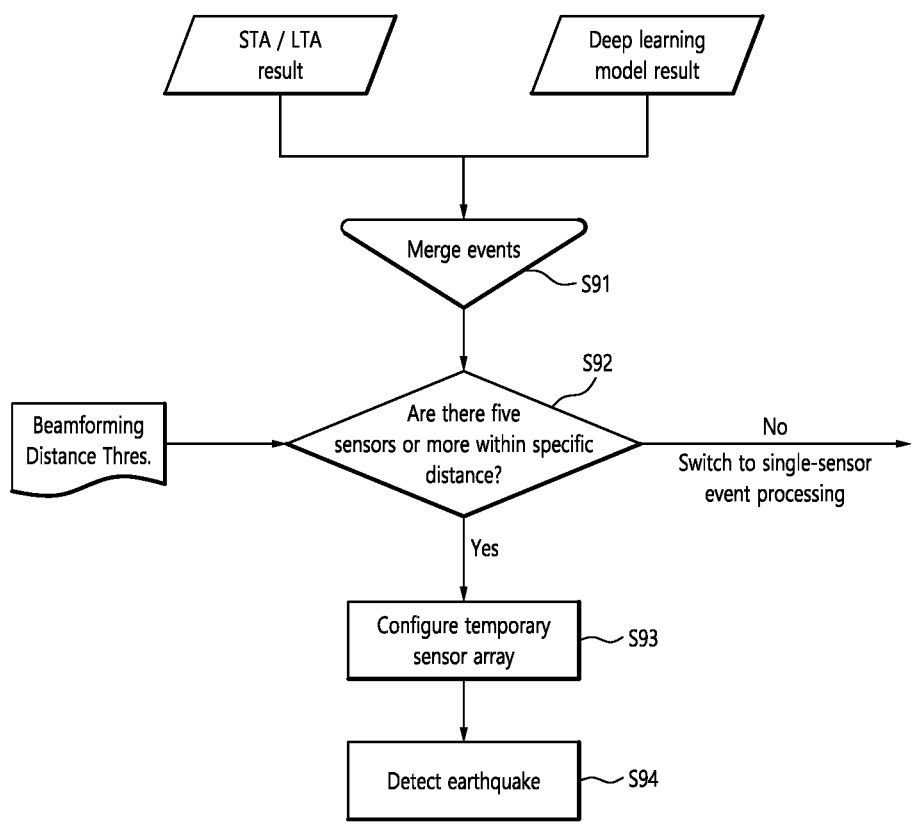
FIG. 10 is a detailed flowchart of a dynamic sensor arrangement configuration and event analysis process of a network earthquake detection algorithm of FIG. 4.

Referring to FIG. 10, events are merged on the basis of the STA/LTA values and noise analysis results (operation S91). When a certain number of (e.g., five) sensors or more are near (e.g., within a default of 2 km from) a corresponding sensor (operation S92), the sensors may be grouped and used as a temporary sensor array (operation S93). Otherwise, single-sensor event processing is performed.

Here, sensors are grouped in odd numbers, and when sensors to be included in an array are selected, the sensors may be inserted in order of quality based on the noise analysis results. As a reference sensor for the sensor array, a sensor that shows lowest noise and best quality in the sensor network is selected to detect an earthquake (operation S94).

Therefore, according to the present invention, event reliability is determined on the basis of earthquake detection results and noise analysis results calculated by single sensors, and only events having high reliability are used in a network earthquake detection algorithm. Accordingly, it is possible to accurately determine whether an earthquake occurs.

According to the above method of detecting an earthquake in a MEMS-based auxiliary seismic observation network, it is determined whether an earthquake actually occurs in the network on the basis of earthquake detection results and noise analysis results calculated by single sensors. Also, the event reliability of each sensor is determined, and only events having high reliability are used in a network earthquake detection algorithm. Accordingly, it is possible to accurately determine whether an earthquake occurs.

The above-described method of detecting an earthquake in a MEMS-based auxiliary seismic observation network may be implemented as an application or program commands that can be executed by various computer components, and recorded on computer-readable recording media. The computer-readable recording media may include program commands, data files, data structures, etc. separately or in combination.

The program commands recorded on the computer-readable recording medium can be specially designed and configured for the present invention or can be known and available to those of ordinary skill in the field of computer software.

Examples of the computer-readable recording media include magnetic media such as a hard disk, a floppy disk, and magnetic tape, optical media such as a CD-ROM and a DVD, magneto-optical media such as a floptical disk, and hardware devices such as a ROM, a RAM, a flash memory, etc., specially designed to store and execute program commands.

Examples of the program commands include machine language code generated by a compiler as well as high-level language code that can be executed by a computer using an interpreter. The hardware devices may be configured to operate as one or more software modules to perform operations according to the present invention, or vice versa.

While the present invention has been described with reference to the embodiments, it will be appreciated by those of ordinary skill in the art that various modifications and alterations can be made from the present invention without departing from the spirit and scope of the present invention described in the following claims.

What is claimed is:

1. A method of detecting an earthquake using a microelectromechanical system (MEMS)-based auxiliary seismic observation network, the method comprising:
    preprocessing acceleration data by performing detrending of removing a moving average from original acceleration data received from single sensors of the MEMS-based auxiliary seismic observation network,
    calculating a short-term average/long-term average (STA/LTA) value using a filter parameter value specified based on the preprocessed acceleration data,
    generating an event occurrence message or an event end message based on the calculated STA/LTA value and transmitting the event occurrence message or the event end message;
    when the event occurrence message is generated, calculating an earthquake probability through an earthquake detection deep learning model using the preprocessed acceleration data as an input;
    analyzing noise by calculating a power spectral density (PSD) from the original acceleration data which is merged at certain intervals;
    determining whether the earthquake occurs in the MEMS-based auxiliary seismic observation network using a network earthquake detection algorithm based on the earthquake probability and a noise analysis result calculated by the single sensors,
    wherein the determining of whether the earthquake occurs in the MEMS-based auxiliary seismic observation network comprises:
    merging events occurring in a preset sensor array;
    when the events occur at more than half of the single sensors in the MEMS-based auxiliary seismic observation network, detecting the earthquake;
    when an event occurs at a specific sensor and a set number of sensors or more are within a certain distance from the specific sensor, grouping the sensors in odd numbers and setting groups as a temporary sensor array;
    inserting the sensors to be included in the sensor array in order of reliability of the sensors based on the noise analysis results; and
    specifying a sensor having lowest noise in the sensor array as a reference sensor of the sensor array.

2. The method of claim 1, wherein the determining of whether the earthquake occurs in the MEMS-based auxiliary seismic observation network comprises:
    grouping the single sensors in the MEMS-based auxiliary seismic observation network as a sensor arrangement; and
    determining reliability of an earthquake event based on the STA/LTA value and the noise analysis result of each single sensor.

3. The method of claim 2, wherein the determining of the reliability of the earthquake event comprises determining the earthquake event as a green event that activates the network earthquake detection algorithm, a yellow event that does not activate the network earthquake detection algorithm on its own but is included in the network earthquake detection algorithm when a certain condition is met, or a red event that is not used in the network earthquake detection algorithm in any case.

4. The method of claim 3, wherein the determining of the reliability of the earthquake event further comprises:
    when the earthquake event is determined to be a green event, converting the STA/LTA value into a valid event;
    when the earthquake is detected through the earthquake detection deep learning model and the earthquake event is determined to be a green or a yellow event, converting the STA/LTA value into a valid event;
    when the earthquake is determined to be a yellow event, changing the yellow event to a valid event when a sensor within a preset distance or closest to a corresponding sensor is green; and
    when the earthquake event is a red event or a threshold time elapses in a validation-waiting state, discarding the earthquake event.

5. The method of claim 1, wherein the calculating of the STA/LTA comprises calculating a square root of a value obtained by adding squares of 3-axis components of the acceleration data to correct an off-axis phenomenon of the sensors.

6. The method of claim 1, wherein the generating of the event occurrence message or the event end message comprises:

when the calculated STA/LTA value is greater than or equal to a preset event occurrence threshold value, determining the calculated STA/LTA value to be event occurrence data; and when the calculated STA/LTA value is smaller than or equal to a preset event end threshold value, determining the calculated STA/LTA value to be event end data.

7. The method of claim 1, wherein the calculating of the earthquake probability through the earthquake detection deep learning model comprises:

extracting a characteristic value through a convolutional neural network (CNN); and calculating the earthquake probability through a recurrent neural network (RNN) based on the extracted characteristic value.

8. The method of claim 1, wherein the analyzing of the noise comprises:

calculating at least one characteristic value among an average, a standard deviation, an interquartile range value, a number of outliers, a difference between a maximum value and a minimum value, and a mean square error regarding two frequency bands as a result of the PSD calculation; and inputting the calculated at least one characteristic value to a clustering model to generate a cluster.

9. A non-transitory computer-readable recording medium on which a computer program for performing the method of detecting an earthquake in a microelectromechanical system (MEMS)-based auxiliary seismic observation network of claim 1 is recorded.

10. A device for detecting an earthquake using a microelectromechanical system (MEMS)-based auxiliary seismic observation network, the device comprising:

a preprocessor configured to preprocess acceleration data by performing detrending of removing a moving average from original acceleration data received from single sensors of the MEMS-based auxiliary seismic observation network;

a short-term average/long-term average (STA/LTA) unit configured to calculate an STA/LTA value using a filter parameter value specified based on the preprocessed acceleration data;

an event generating unit configured to generate an event occurrence message or an event end message based on the calculated STA/LTA value and transmit the event occurrence message or the event end message;

a deep learning unit configured to calculate an earthquake probability through an earthquake detection deep learning model using the preprocessed acceleration data as an input when the event occurrence message is generated;

a noise analyzing unit configured to analyze noise by calculating a power spectral density (PSD) from the original acceleration data which is merged at certain intervals;

a network-based earthquake detection module configured to determine whether the earthquake occurs in the MEMS-based auxiliary seismic observation network using a network earthquake detection algorithm based on the earthquake probability and a noise analysis result calculated by the single sensors, wherein the network-based earthquake detection module is further configured to merge events occurring in a preset sensor array, and detect the earthquake when the events occur at more than half of single sensors in the MEMS-based auxiliary seismic observation network, and wherein, when an event occurs at a specific sensor and a set number of sensors or more are within a certain distance from the specific sensor, the network-based earthquake detection module designates a sensor having lowest noise in a sensor array as a reference sensor of the sensor array, inserts the sensors to the sensor array in order of reliability of the sensors based on noise analysis results, and groups the sensors in odd numbers to set a temporary sensor array.

11. The device of claim 10, wherein the network-based earthquake detection module comprises:

a sensor arranging unit configured to group the single sensors in the MEMS-based auxiliary seismic observation network as a sensor arrangement; and a reliability determining unit configured to determine reliability of an earthquake event based on the STA/LTA value and the noise analysis result of each single sensor.

12. The device of claim 11, wherein the reliability determining unit is further configured to determine the earthquake event as a green event that activates the network earthquake detection algorithm, a yellow event that does not activate the network earthquake detection algorithm on its own but is included in the network earthquake detection algorithm when a certain condition is met, or a red event that is not used in the network earthquake detection algorithm in any case.

13. The device of claim 12, wherein the network-based earthquake detection module further comprises an event validating unit configured to:

convert the STA/LTA value into a valid event when the earthquake event is determined to be a green event;

change the earthquake event to a valid event when the earthquake is detected through the earthquake detection deep learning model and the earthquake event is determined to be a green or yellow event;

when the earthquake is determined to be a yellow event, change the yellow event to a valid event when a sensor within a preset distance or closest to a corresponding sensor is green; and discard the earthquake event when the earthquake event is a red event or a threshold time elapses in a validation-waiting state.

14. The device of claim 10, wherein the STA/LTA unit calculates a square root of a value obtained by adding squares of 3-axis components of the acceleration data to correct an off-axis phenomenon of the sensors.

15. The device of claim 10, wherein the event generating unit is further configured to determine the calculated STA/LTA value to be event occurrence data when the calculated STA/LTA value is greater than or equal to a preset event occurrence threshold value, and determine the calculated STA/LTA value to be event end data when the calculated STA/LTA value is smaller than or equal to a preset event end threshold value.

16. The device of claim 10, wherein the deep learning unit comprises:

a convolutional neural network (CNN) unit configured to extract a characteristic value; and a recurrent neural network (RNN) unit configured to calculate the earthquake probability based on the extracted characteristic value.

17. The device of claim 10, wherein the noise analyzing unit is further configured to calculate at least one characteristic value among an average, a standard deviation, an interquartile range value, a number of outliers, a difference between a maximum value and a minimum value, and a mean square error regarding two frequency bands as a result of the PSD calculation, and input the calculated at least one characteristic value to a clustering model to generate a cluster.

* * * * *